(12) United States Patent
Ekambaram et al.

(10) Patent No.: US 10,531,560 B2
(45) Date of Patent: Jan. 7, 2020

(54) USE OF CONDUCTING FLUID IN PRINTED CIRCUITS

(71) Applicant: International Business Machines Corporation, Armonk, NY (US)

(72) Inventors: Vijay Ekambaram, Tamilnadu (IN); Manikandan Padmanaban, Bangalore (IN); Sarbajit K. Rakshit, Kolkata (IN)

(73) Assignee: International Business Machines Corporation, Armonk, NY (US)

( * ) Notice: Subject to any disclaimer, the term of this patent is extended or adjusted under 35 U.S.C. 154(b) by 290 days.

(21) Appl. No.: 15/086,103

(22) Filed: Mar. 31, 2016

(65) Prior Publication Data
US 2017/0287663 A1    Oct. 5, 2017

(51) Int. Cl.
| | | |
|---|---|---|
| F15B 15/00 | (2006.01) | |
| H05K 1/02 | (2006.01) | |
| H01H 29/04 | (2006.01) | |
| H01H 29/00 | (2006.01) | |

(52) U.S. Cl.
CPC .......... *H05K 1/0272* (2013.01); *H01H 29/04* (2013.01); *H01H 2029/008* (2013.01); *H05K 1/0293* (2013.01); *H05K 2201/10053* (2013.01); *H05K 2203/128* (2013.01)

(58) Field of Classification Search
CPC .......... B25J 19/00; F15B 15/00; F15B 15/10; H01H 2029/008; H01H 29/28; H01H 1/0036; H01H 2061/006; H01H 29/00; H01H 59/0009; H01H 29/06; H01H 2001/0042
See application file for complete search history.

(56) References Cited

U.S. PATENT DOCUMENTS

| | | | |
|---|---|---|---|
| 7,618,524 B1 | 11/2009 | Shepodd et al. | |
| 7,939,945 B2 | 5/2011 | Sauciuc et al. | |
| 8,414,785 B2 | 4/2013 | Walker et al. | |
| 2004/0112442 A1* | 6/2004 | Maerkl | B01L 3/502738 137/597 |

(Continued)

OTHER PUBLICATIONS

Duncan et al., "Pneumatic oscillator circuits for timing and control of integrated microfluidics", Department of Biomedical Engineering, University of California, Irvine, CA 92697, 18104-18109, PNAS, Nov. 5, 2013, Vo. 110, No. 45, 6 pages.

(Continued)

*Primary Examiner* — Ahmed M Saeed
(74) *Attorney, Agent, or Firm* — Stephen R. Yoder; David B. Woycechowsky

(57) ABSTRACT

An apparatus for toggling circuits includes a plurality of parallel channels each having a first end and a second end, a plurality of ports transverse to the plurality of parallel channels, wherein each port has a plurality of valves corresponding to the plurality of parallel channels, wherein each valve selectively opens and closes in response to an input and wherein opening a valve fills a portion of a port with a conducting fluid. The apparatus also includes a controller communicatively coupled to the input of each valve and configured to complete an electric circuit between the first end of the parallel channel and the port corresponding to the valve when the controller opens the valve. A method executed by a computer and a corresponding computer program product are also disclosed herein.

9 Claims, 5 Drawing Sheets

(56) References Cited

U.S. PATENT DOCUMENTS

| | | | |
|---|---|---|---|
| 2012/0160621 A1* | 6/2012 | Battlogg | B60G 17/08 |
| | | | 188/267.2 |
| 2013/0243655 A1 | 9/2013 | Li et al. | |
| 2014/0354318 A1 | 12/2014 | Oh et al. | |
| 2015/0258273 A1* | 9/2015 | Payne | F15C 3/04 |
| | | | 604/67 |
| 2016/0029618 A1* | 2/2016 | Gain | A01N 1/0247 |
| | | | 435/284.1 |

OTHER PUBLICATIONS

Johnston, Casey, "Microfluidics panel could add physical buttons to a touch screen", Gear & Gadets / Product News & Reviews, Jan. 23, 2014, 2 pages, <http://arstechnica.com/gadgets/2014/01/new-microfluidics-panel-could-add-physical-buttons-to-a-touch-screen/>.

Kohl et al., "A microfluidic experimental platform with internal pressure measurements", George Woodruff School of Mechanical Engineering, Georgia Institute of Technology, Atlanta, GA 30332-0405, USA, Received May 4, 2004; received in revised form Jul. 26, 2004; accepted Jul. 27, 2004, Available online Oct. 3, 2004. © 2004 Elsevier B.V., 10 pages.

Mosadegh, Bobak, "Design and Fabrication of Microfluidic Integrated Circuits using Normally-Closed Elastomeric Valves", A dissertation submitted in partial fulfillment of the requirements for the degree of Doctor of Philosophy (Biomedical Engineering) In The University of Michigan, 2010, 177 pages.

Oh et al., "A review of microvalves", Institute of Physics Publishing, Journal of Micromechanics and Microengineering, J. Micromech. Microeng. 16 (2006) R13-R39, doi:10.1088/0960-1317/16/5/R01, © 2006 IOP Publishing Ltd, 27 pages.

Sabry et al., "Integrated Microfluidic Power Generation and Cooling for Bright Silicon MPSoCs", 78-3-9815370-2-4/DATE14/ ©2014 EDAA, 6 pages.

Verpoorte et al., "Microfluidics Meets MEMS", Proceedings of the IEEE, vol. 91, No. 6, Jun. 2003, © 2003 IEEE, 24 pages.

Wu et al., "A Printed Circuit Board Based Microfluidic System for Point-of-Care Diagnostics Applications", 15th International Conference on Miniaturized Systems for Chemistry and Life Sciences Oct. 2-6, 2011, Seattle, Washington, USA, 3 pages.

Wu et al., "Microfluidic Printed Circuit Boards", 2011 Electronic Components and Technology Conference, © 2011 IEEE, 6 pages.

"Modular, breadboardable components combine for a microfluidics workstation.", LabSmith Microfluidics High Voltage Power Supplies Pumps Valves Timing, LabSmith Tools for Science, printed on Jan. 28, 2016, 1 page, <http://labsmith.com/>.

"Research Highlights", Lab on a Chip, DOI: 10.1039/b312860c, This journal is © The Royal Society of Chemistry 2003, Lab Chip, 2003, 3, 53N-55N, 3 pages.

\* cited by examiner

USE OF CONDUCTING FLUID IN PRINTED CIRCUITS

BACKGROUND OF THE INVENTION

The present invention relates generally to printed circuits, and more specifically, to the use of conducting fluids to toggle individual electric circuits.

In the field of printed circuits, control of the connectivity of individual circuits is difficult. One reason for this is that printed circuits have grown increasingly complicated as the complexity of printed circuits increases. One challenge is to maintain control over each individual circuit despite the number of circuits increasing and the dimensions of each circuit decreasing.

SUMMARY

As disclosed herein, an apparatus for toggling circuits includes a plurality of parallel channels each having a first end and a second end, a plurality of ports transverse to the plurality of parallel channels, wherein each port has a plurality of valves corresponding to the plurality of parallel channels, wherein each valve selectively opens and closes in response to an input and wherein opening a valve fills a portion of a port with a conducting fluid. The apparatus also includes a controller communicatively coupled to the input of each valve and configured to complete an electric circuit between the first end of the parallel channel and the port corresponding to the valve when the controller opens the valve. A method executed by a computer and a corresponding computer program product are also disclosed herein.

DETAILED DESCRIPTION

Embodiments of the present invention relate generally to printed circuits, and more specifically, to the use of conducting fluids to toggle individual electric circuits. Insertion of conducting fluid into a microchannel may be used to complete an electric circuit, just as removing the conducting fluid may break the circuit. Thus, selectively controlling the presence/absence of conducting fluid in microchannels may provide a means of controlling the activity of circuits on a printed circuit board. Furthermore, use of conducting fluids in printed circuits may enable circuits to be highly compact while also possessing redundancies that make the circuits tolerant to damage.

It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following drawings, description and appended claims, or may be learned by the practice of the invention as set forth hereinafter. The present invention will now be described in detail with reference to the figures.

Figure 1A:
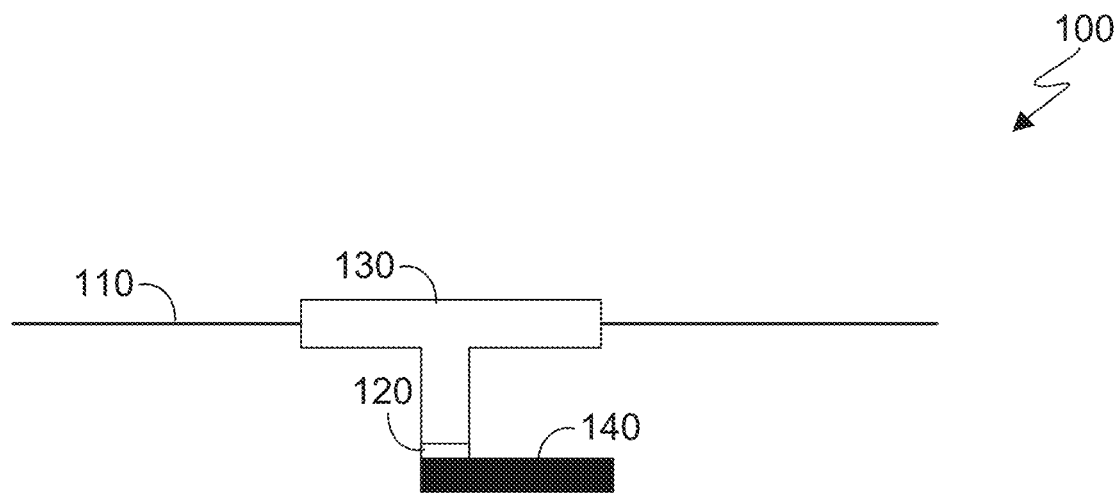
FIGS. 1A and 1B depict examples of one embodiment of a microvalve in accordance with the present invention.
Figure 1B:
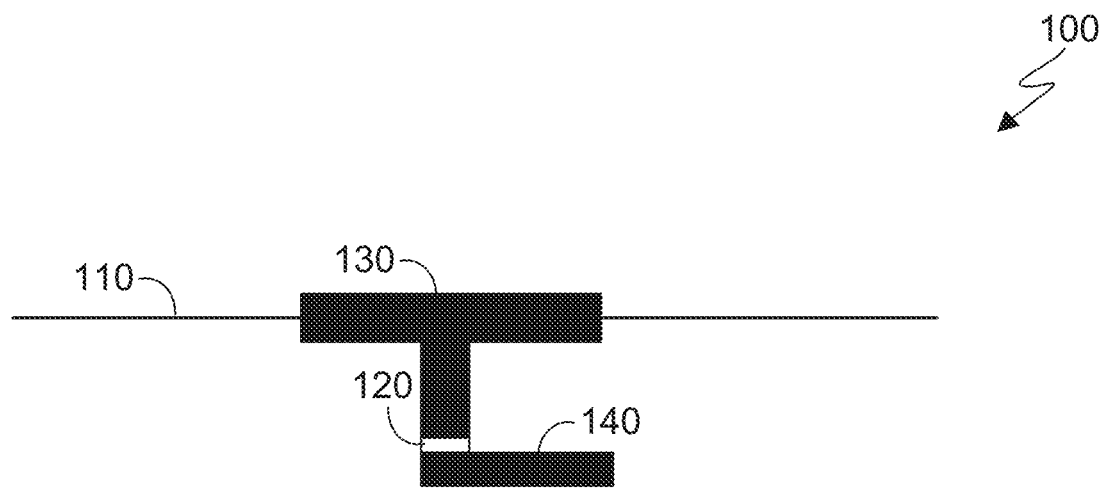

FIGS. 1A and 1B depict examples of one embodiment of a microvalve in accordance with the present invention. As depicted, microvalve 100 includes a conduction path 110, a microvalve 120, a port 130, and a conducting fluid 140. FIG. 1A depicts a closed microvalve 120 that prevents the conducting fluid 140 from entering the port 130, whereas FIG. 1B depicts an open microvalve 120, which may enable the conducting fluid 140 to enter port 130.

Conduction path 110 may be a conductive trace of a circuit. In some embodiments, microvalve 100 is one of many microvalves positioned serially along a portion of conduction path 110. Conduction path 110 may be made of any conducting material used in printed circuitry, such as copper, silver, gold, aluminum, alloys thereof, graphene, and the like. The printed circuitry may be printed on a rigid or flexible printed circuit medium.

Microvalve 120 may be a microstructure acting as a valve that, when closed, substantially impedes the flow of conducting fluid 140. Microvalve 120 may be an active microvalve or passive microvalve. Active microvalves may include mechanical, non-mechanical, and external microvalves. Mechanical microvalves in turn may include magnetic, electric, piezoelectric, thermal, and bistable microvalves. Non-mechanical microvalves may include electrochemical, phase change, and rheological microvalves. External microvalves may include modular and pneumatic microvalves. In embodiments where microvalve 120 is a passive microvalve, microvalve 120 is either a mechanical check-valve microvalve, or a capillary microvalve.

Port 130 may be a chamber or cavity that is empty when microvalve 120 is closed, but fills with conducting fluid 140 when microvalve 120 opens. When filled with conducting fluid 140, port 130 may complete a circuit in the conduction path 110, enabling electrons to flow from one end of conduction path 110, through port 130, and into the other end of conduction path 110, as depicted in FIG. 1B. When conducting fluid 140 is removed from port 130 and microvalve 120 is closed (as depicted in FIG. 1A), port 130 may act as an insulator that disrupts electron flow through conduction path 110.

Conducting fluid 140 may be any sort of fluid capable of bridging the gap in conduction path 110 so that electrons can pass through port 130. Conducting fluid 140 may be selected based on one or several fluid properties, such as density, viscosity, electric conductivity, and thermal conductivity. Conducting fluid 140 may also be selected based on its hydraulic friction factor formed at the surfaces of the conduction path 110, microvalve 120, and/or port 130. In some embodiments, conducting fluid 140 is selected based on its Reynolds number achieved when conducting fluid 140 flows into or out of port 130. Conducting fluid 140 may include metals, such as mercury or gallium, that are liquid at temperatures associated with computing. In some embodiments, conducting fluid 140 includes any metallic or non-metallic element, compound, mixture, suspension, solution, or other combination that is capable of exhibiting fluid properties and conducting electrons through port 130. Conducting fluid 140 may be a conductive ink. In some embodiments, conducting fluid 140 is stored in a reservoir such as one of the channels 230A-230C depicted in FIGS. 2A-2B.

Figure 2A:
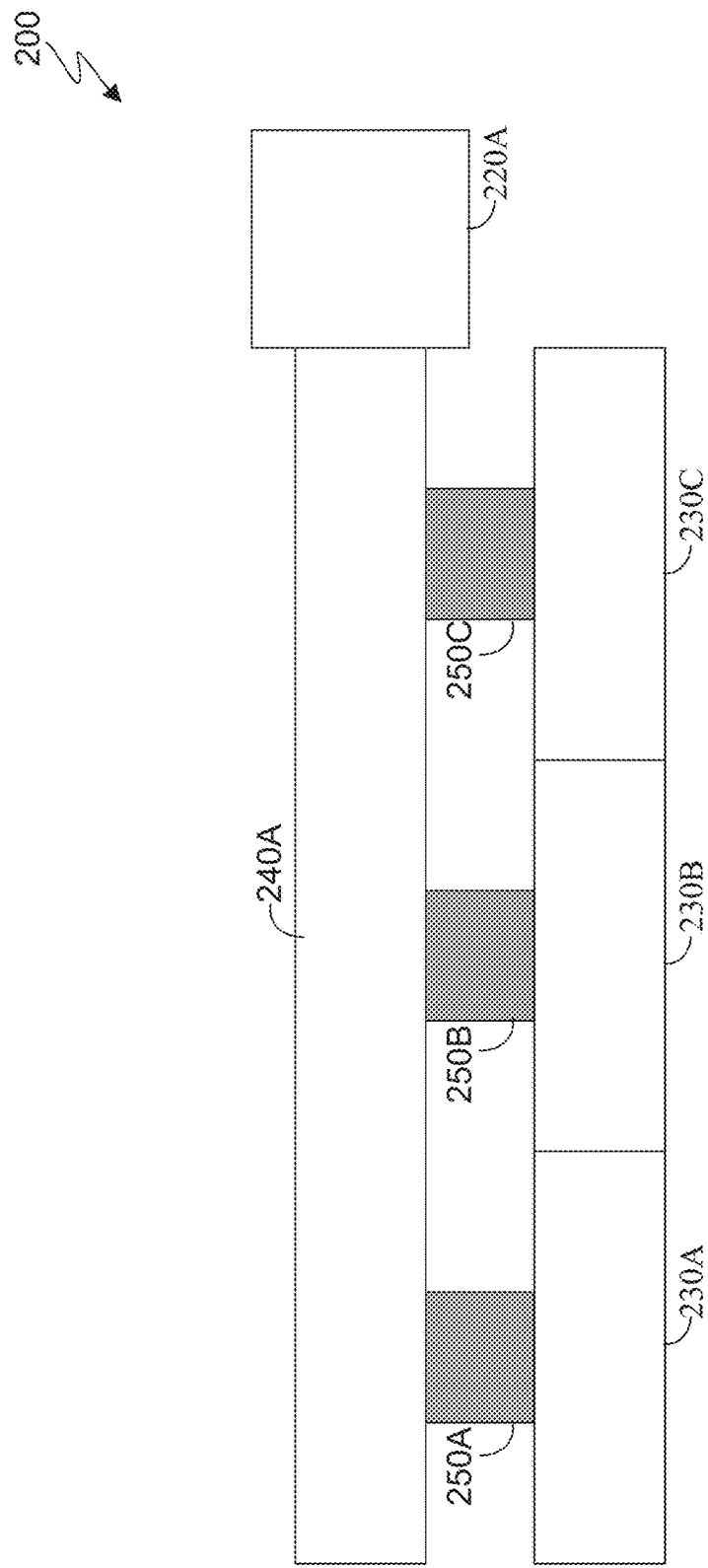
FIGS. 2A-2B depict examples of embodiments of a controllable circuitry in accordance with the present invention.
Figure 2B:
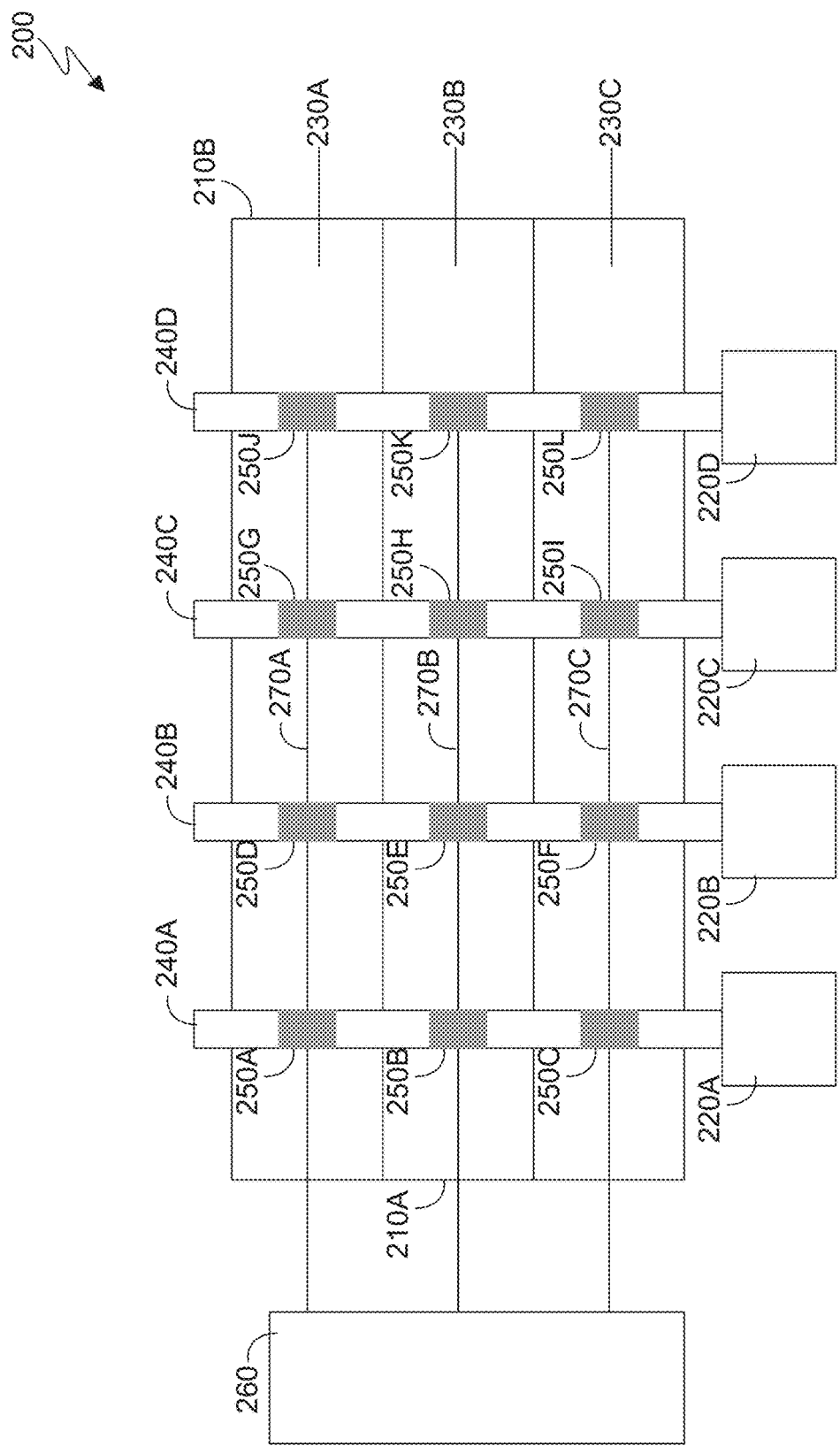

FIGS. 2A-2B depict examples of embodiments of controllable circuitry 200 in accordance with the present invention. FIG. 2A is a side view and FIG. 2B is a top view. As depicted, controllable circuitry 200 includes channel ends 210A and 210B, circuit terminals 220A-220D, channels 230A-230C, ports 240A-240D, and microvalves 250A-250L, as well as controller 260 and controller circuits 270A-270C. In the depicted embodiment, there are three channels 230A-230C, which corresponds to a redundancy factor of three for controlling each circuit.

FIG. 2A is a side view of controllable circuitry 200 to illustrate the relation between the channels 230A-230C, microvalves 250A-250C, port 240A and circuit terminal 220A. The various dimensions of controllable circuitry 200 may be exaggerated for clarity. Conducting fluid may be stored in each of the channels 230A-230C. In some embodiments, the conducting fluid is pumped into or out of channels 230A-230C on demand. When a microvalve opens, conducting fluid flows from a channel through the microvalve and to the port, which enables electricity to flow to circuit terminal 220A and activate a circuit. For example, when microvalve 250B opens, conducting fluid flows from 230B to contact port 240A, completing a circuit. When the circuit is to be deactivated, the conducting fluid may be removed from the opened microvalve, at which point the microvalve may close. In some embodiments, the conducting fluid is removed via application of a negative pressure. The embodiment depicted in FIG. 2A may be considered to have a redundancy factor of three, as the circuit can be activated by opening either microvalve 250A, 250B, or 250C.

Turning to FIG. 2B, controllable circuitry 200 has three parallel channels, 230A-230C, which are bounded by channel ends 210A and 210B. Channels 230A-230C may be capable of housing a conducting fluid such as conducting fluid 140 as described in FIGS. 1A and 1B. In some embodiments, channel ends 210A-210B and walls of channels 230A-230C act as boundaries that confine the conducting fluid within one or more of the channels 230A-230C.

Circuits may be activated or deactivated by completing or breaking an electrical connection between channel end 210A and one of the circuit terminals, such as circuit terminal 210A. In one embodiment, a circuit is activated when a microvalve opens to allow conducting fluid to complete a circuit in a port, which electrically connects channel end 210A with a circuit terminal corresponding to the open microvalve and port. For example, when microvalve 250A opens, conducting fluid that was confined to channel 230A may flow into port 240A, which completes an electrical connection between channel end 210A and circuit terminal 220A.

The controllable circuitry 200 thus may be controlled by selectively opening/closing one or more of the microvalves. If, for example, microvalve 250B is damaged, then the circuit spanning channel end 210A to circuit terminal 220A may still be controllable by opening/closing either microvalve 250A or 250C. Thus, because there are three channels 230A-230C in the depicted example, each of the four circuits in the depicted example has a redundancy factor of three. Ports 240A-240D may contain a conductor that enables electricity to flow from channel end 210A through a conducting fluid in a channel (such as channel 230C), to an open microvalve (such as microvalve 250H) in a port (such as port 240C), and then to the circuit terminal associated with that port (such as circuit terminal 220C). In some embodiments, there are more or fewer channels, as a higher number of channels may increase cost and/or scale up the redundancy of controllable circuitry 200.

Controller 260 may include any sort of digital controller capable of signaling the microvalves 250A-250L with instructions to open and/or close. Controller 260 may open and close each microvalve 250A-250L independently using controller circuits 270A-270C. In some embodiments, controller 260 itself receives instructions from another microprocessor. Controller 260 may communicate independently with each microvalve 250A-250L via one of the controller circuits 270A-270C. For example, in order to open microvalves 250B and 250E and to close microvalve 250J, controller signals microvalves 250B and 250E to open via controller circuit 270B, and signals microvalve 250J to close via controller circuit 270A. When controller 260 signals a microvalve to close, the microvalve may pump the conducting fluid out of the microvalve and its corresponding port before closing, which may ensure that the electrical circuit is severed. When conducting fluid is not being used by a port or microvalve to complete a circuit, the conducting fluid may be stored in a reservoir such as channels 230A-230C.

Figure 3:
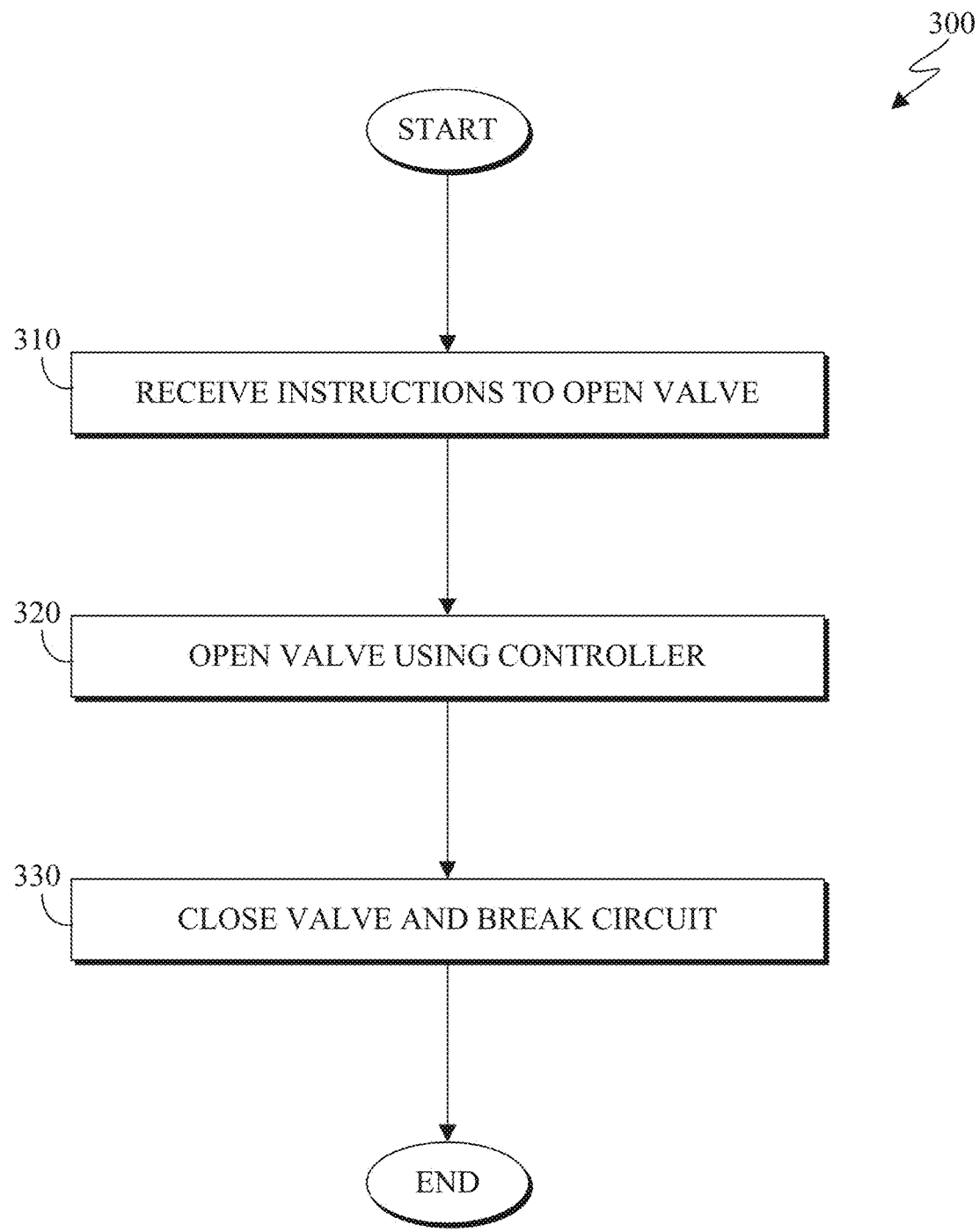
FIG. 3 is a flow chart depicting one embodiment of a circuit toggling method in accordance with the present invention.

FIG. 3 is a flow chart depicting one embodiment of a circuit toggling method in accordance with the present invention. As depicted, circuit toggling method 300 includes receiving (310) instructions, opening (320) a valve, and closing (330) a valve. The circuit toggling method 300 may thus be used to selectively activate or deactivate a particular circuit, such as the circuits depicted in FIGS. 2A-2B.

Receiving (310) instructions to open a valve may include a microvalve receiving a signal to open. In some embodiments, the microvalve receives the signal from a controller, such as controller 260 depicted in FIG. 2B. Opening (320) the valve may occur in response to receiving (310) instructions to open the valve. When the microvalve opens, a conducting fluid that the microvalve was previously holding back may enter a space such that an electrical circuit is completed. In some embodiments, the conducting fluid bridges an otherwise insulator gap, enabling electrons to flow through the fluid and across the gap.

Closing (330) the valve and breaking the circuit may include removing the conducting fluid, closing the valve, and breaking the electrical circuit formed as a result of valve opening operation 320. In some embodiments, the conducting fluid is returned to a storage reservoir, such as one of the channels 230A-230C depicted in FIGS. 2A-2B. Once the conducting fluid is removed and the valve is closed, the electrical circuit is broken and thus, the circuit is deactivated. The valve closing operation 330 may occur in response to a signal received from a controller. By repeating circuit toggling method 300 individual circuits may be selectively activated and deactivated.

Figure 4:
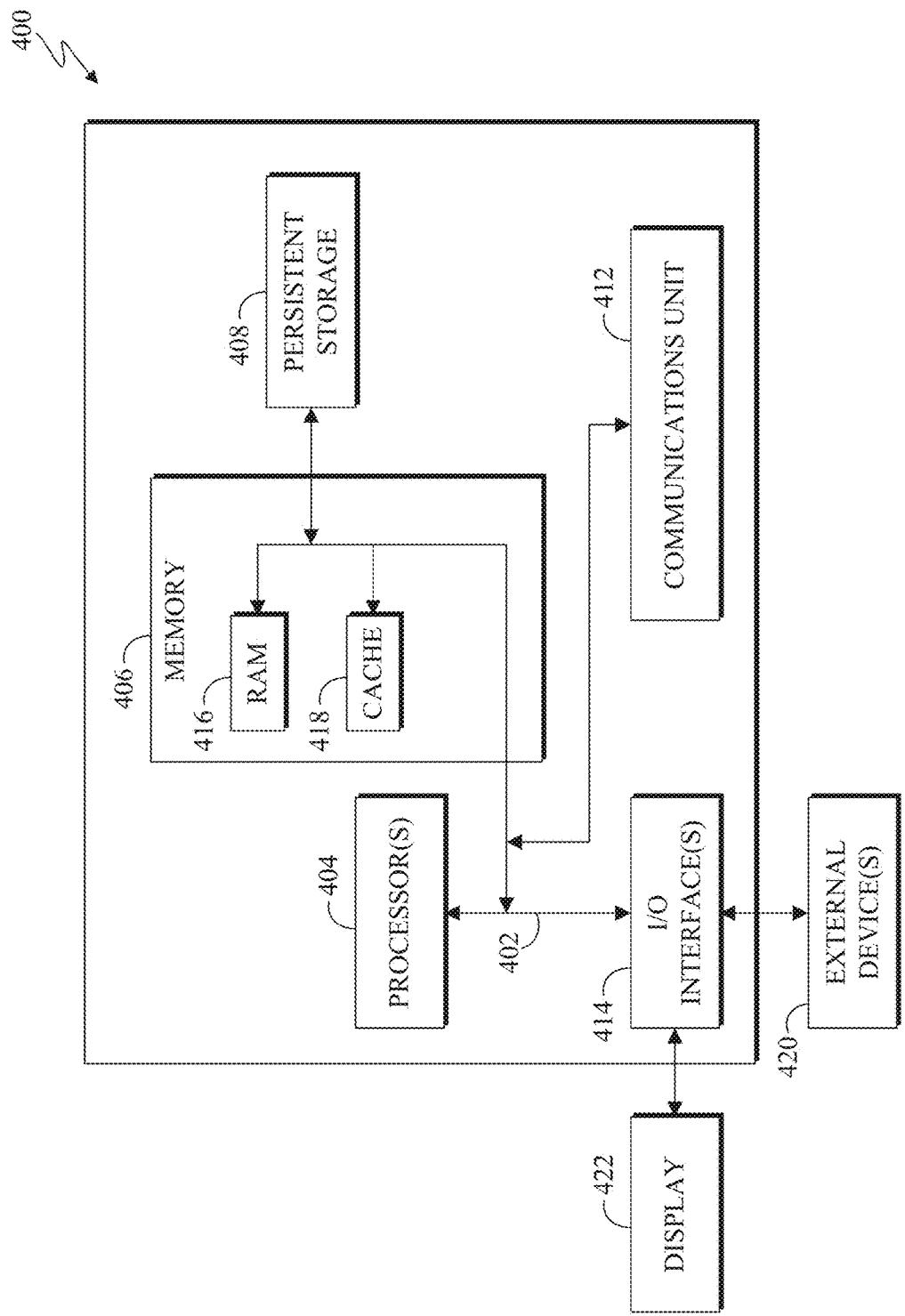
FIG. 4 is a block diagram depicting one example of a computing apparatus (i.e., computer) suitable for executing the methods disclosed herein.

FIG. 4 is a block diagram depicting components of a computer 400 suitable for executing the methods disclosed herein. It should be appreciated that FIG. 4 provides only an illustration of one embodiment and does not imply any limitations with regard to the environments in which different embodiments may be implemented. Many modifications to the depicted environment may be made.

As depicted, the computer 400 includes communications fabric 402, which provides communications between computer processor(s) 404, memory 406, persistent storage 408, communications unit 412, and input/output (I/O) interface(s) 414. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer readable storage media. In the depicted embodiment, memory 406 includes random access memory (RAM) 416 and cache memory 418. In general, memory 406 can include any suitable volatile or non-volatile computer readable storage media.

One or more programs may be stored in persistent storage 408 for execution by one or more of the respective computer processors 404 via one or more memories of memory 406. The persistent storage 408 may be a magnetic hard disk drive, a solid state hard drive, a semiconductor storage device, read-only memory (ROM), erasable programmable read-only memory (EPROM), flash memory, or any other computer readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer readable storage medium that is also part of persistent storage 408.

Communications unit 412, in these examples, provides for communications with other data processing systems or devices. In these examples, communications unit 412 includes one or more network interface cards. Communications unit 412 may provide communications through the use of either or both physical and wireless communications links.

I/O interface(s) 414 allows for input and output of data with other devices that may be connected to computer 400. For example, I/O interface 414 may provide a connection to external devices 420 such as a keyboard, keypad, a touch screen, and/or some other suitable input device. External devices 420 can also include portable computer readable storage media such as, for example, thumb drives, portable optical or magnetic disks, and memory cards. Software and data used to practice embodiments of the present invention can be stored on such portable computer readable storage media and can be loaded onto persistent storage 408 via I/O interface(s) 414. I/O interface(s) 414 may also connect to a display 422. Display 422 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The embodiments disclosed herein include a system, a method, and/or a computer program product. The computer program product may include a computer readable storage medium (or media) having computer readable program instructions thereon for causing a processor to carry out the methods disclosed herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An apparatus comprising:
   a first conduction path in the form of a printed circuit board trace, with the first conduction path having a first microfluidic port interface and a second microfluidic port interface;
   a microfluidic port extending between the first microfluidic port interface and the second microfluidic port interface, with the microfluidic port defining an interior space sized and shaped to contain microfluidic conducting fluid;
   a first microvalve connected in fluid communication with the first microfluidic port with the first microvalve being structured to selectively: (i) fill the first microfluidic port with the microfluidic conducting fluid, and (ii) empty the first microfluidic port of the microfluidic conducting fluid; and
   a controller communicatively coupled to the first valve and configured to selectively deliver an input signal to the first valve, so that the input signal selectively opens and closes the first valve to thereby help control the filling and emptying of the first microfluidic port with the microfluidic conducting fluid, with the filling and emptying of the first microfluidic port with the microfluidic conducting fluid being a mechanism to conduct electrical power through the first conduction path;
   wherein the first microvalve is structured, shaped and sized as an active non-mechanical microvalve.

2. The apparatus of claim 1 wherein the first microvalve is actuated by chemical phase changes.

3. The apparatus of claim 1 wherein the first microvalve is actuated by electrochemical reactions.

4. The apparatus of claim 1 wherein the first microvalve is actuated by rheological action.

5. The apparatus of claim 1, wherein upon failure of a conduction path of a plurality of conduction paths, the conduction of electrical power through the first conduction path is selectively completable via any remaining conduction path that has not failed.

6. An apparatus comprising:
   a first conduction path in the form of a printed circuit board trace, with the first conduction path having a first microfluidic port interface and a second microfluidic port interface;
   a microfluidic port extending between the first microfluidic port interface and the second microfluidic port interface, with the microfluidic port defining an interior space sized and shaped to contain microfluidic conducting fluid;
   a first microvalve connected in fluid communication with the first microfluidic port with the first microvalve being structured to selectively: (i) fill the first microfluidic port with the microfluidic conducting fluid, and (ii) empty the first microfluidic port of the microfluidic conducting fluid; and
   a controller communicatively coupled to the first valve and configured to selectively deliver an input signal to the first valve, so that the input signal selectively opens and closes the first valve to thereby help control the filling and emptying of the first microfluidic port with the microfluidic conducting fluid, with the filling and emptying of the first microfluidic port with the microfluidic conducting fluid being a mechanism to conduct electrical power through the first conduction path;
   wherein the first microvalve is structured, shaped and sized as a passive valve.

7. The apparatus of claim 6 wherein the first microvalve structured as a mechanical check valve.

8. The apparatus of claim 6 wherein the first microvalve is structured as a capillary.

9. The apparatus of claim 6 wherein upon failure of a conduction path of a plurality of conduction paths, the conduction of electrical power through the first conduction path is selectively completable via any remaining conduction path that has not failed.

\* \* \* \* \*